(12) United States Patent
Bateman

(10) Patent No.: US 9,437,291 B2
(45) Date of Patent: Sep. 6, 2016

(54) DISTRIBUTED CASCODE CURRENT SOURCE FOR RRAM SET CURRENT LIMITATION

(71) Applicant: Rambus Inc., Sunnyvale, CA (US)

(72) Inventor: Bruce Lynn Bateman, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/605,866

(22) Filed: Jan. 26, 2015

(65) Prior Publication Data

US 2015/0243354 A1   Aug. 27, 2015

Related U.S. Application Data

(60) Provisional application No. 61/944,694, filed on Feb. 26, 2014.

(51) Int. Cl.
*G11C 13/00* (2006.01)
*G11C 5/06* (2006.01)

(52) U.S. Cl.
CPC ......... *G11C 13/0038* (2013.01); *G11C 13/003* (2013.01); *G11C 5/06* (2013.01)

(58) Field of Classification Search
USPC ........................................................ 365/148
See application file for complete search history.

(56) References Cited

U.S. PATENT DOCUMENTS

| | | | |
|---|---|---|---|
| 6,496,417 B1 * | 12/2002 | Shiau | G11C 16/107 365/185.18 |
| 7,920,421 B2 | 4/2011 | Maejima et al. | |
| 7,965,538 B2 | 6/2011 | Ahn et al. | |
| 8,004,872 B2 | 8/2011 | Jung et al. | |
| 2007/0070682 A1 * | 3/2007 | Nakashima | G11C 13/0007 365/148 |
| 2008/0123393 A1 | 5/2008 | Kinoshita | |
| 2013/0010527 A1 | 1/2013 | Ma et al. | |
| 2013/0215669 A1 * | 8/2013 | Haukness | G11C 13/0007 365/148 |

* cited by examiner

*Primary Examiner* — Huan Hoang
*Assistant Examiner* — Minh Dinh
(74) *Attorney, Agent, or Firm* — Lowenstein Sandler LLP

(57) ABSTRACT

In one example, a current limited device is coupled between a source line of a memory cell array and a supply voltage, and configured to operate in a constant current mode during an access operation of a memory cell. An array control circuitry may be coupled to the memory cell array, and configured to control the constant current mode and supply an associated select bias voltage to the word line select transistor.

18 Claims, 6 Drawing Sheets

DISTRIBUTED CASCODE CURRENT SOURCE FOR RRAM SET CURRENT LIMITATION

PRIORITY

This application claims benefit of U.S. Provisional Application No. 61/944,694 filed on Feb. 26, 2014, entitled: DISTRIBUTED CASCODE CURRENT SOURCE FOR RRAM SET CURRENT LIMITATION, which is herein incorporated by reference in its entirety.

COPYRIGHT NOTICE

© 2014 Rambus, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all rights whatsoever available under 37 CFR §1.71(d).

BACKGROUND

Several types of non-volatile memory have been developed that rely on resistive memory elements that change resistance under certain conditions. This general category of memory may be referred to as resistive change memory (a.k.a., Resistive Random Access Memory (RRAM)). An RRAM memory element represents stored information as a low resistance state and one or more distinct high resistance states. A dielectric, which is normally insulating, can be made to conduct through the formation of a conducting filament or path. This filament is formed as a result of the application of a sufficiently high voltage (i.e., electric field).

Depending on the type of RRAM memory element, the conduction path formation can arise from different mechanisms. These mechanisms include defect modification, metal migration, ion migration, etc. Forming the filament is generally referred to as "setting" the RRAM memory element. Breaking the filament, usually by applying an appropriately high voltage of an opposite polarity, results in the RRAM memory element resuming a high resistance. This process is generally referred to as "resetting" the RRAM memory element. The RRAM memory element may be "set" and "reset" many times by appropriately applied voltages.

The process of "setting" an RRAM memory element involves applying a sufficiently high voltage (i.e., electric field) across the RRAM memory element. This electric field causes a dramatic reduction in the resistance of the RRAM memory element. This reduction in the resistance of the RRAM memory element remains until the device is "reset" by the application of another sufficiently high voltage—usually of opposite polarity. In some implementations, RRAM memory elements may be paired with an access transistor in an RRAM cell. The access transistor selectively allows current to be passed through, and voltage applied to, the RRAM memory element so that its state may be determined and/or changed. These cells may be arranged in an array so that a particular RRAM cell in the array may be set, reset, or read. Typically, a column of the array is accessed (or controlled) via a conductive path (or wire) that is referred to as a bit line. A row of the array is accessed (or controlled) via a conductive path (or wire) that is referred to a word line.

US Patent Publication No. 2013/0215669 describes a current flowing through the memory element in association with switching the memory element from the high resistance state to the low resistance state. Namely, responsive to the switching, a magnitude of the current flowing through the memory element increases by the ratio of the resistance change. This current flow may cause the filament to grow in size, which can increase a threshold required to switch back to the high resistance state. US Patent Publication No. 2013/0215669, which is herein incorporated by reference in its entirety, describes biasing the select MOS transistor in a 1T-1R memory cell into saturation to act as a current source in order to limit the RRAM element current in a set operation when the element switches from a high resistance state to a low resistance state.

BRIEF DRAWINGS DESCRIPTION

DETAILED DESCRIPTION

A source line may be pulled low by a Metal Oxide Semiconductor (MOS) transistor biased into saturation to act as a constant current source. The gate of a cell select Field-Effect Transistor (FET), e.g. the word line, may be biased higher at greater than, e.g. a little more than, a threshold voltage above the gate of the source line pull-down transistor. The bit lines and/or word lines of the remaining cells on the source line may be biased such that they do not conduct any current.

The biasing corresponding to the selected cell may cause the transistor in the selected cell to pull the source line up to less than, e.g. a little less than, one voltage threshold below the word line voltage and to act as a cascode stage positioned between the source line and the RRAM element of the selected cell. This voltage may be sufficient to maintain the source line pull-down transistor in saturation such that it may continue to act as a constant current source independent of small fluctuations in the source-line voltage.

In this configuration, the specific voltage that will appear on the source line may vary as a function of the voltage threshold of the select transistor in the selected cell. If the voltage threshold is low, the source line may rise (charged by the cell current) until the normalized saturation drain current ($I_{DSAT}$) of the cell select transistor matches the $I_{DSAT}$ of the source line pull-down transistor. According, the variation of a threshold voltage of the cell select transistor (in an advanced Complementary Metal Oxide Semiconductor (CMOS) process where the variation in transistor threshold voltage from device to device can be relatively large, for example 150-200 mV) may be addressed by the self-compensating effect of the cascode configuration between the cell select transistor and the source line pull-down transistor.

Figure 1:
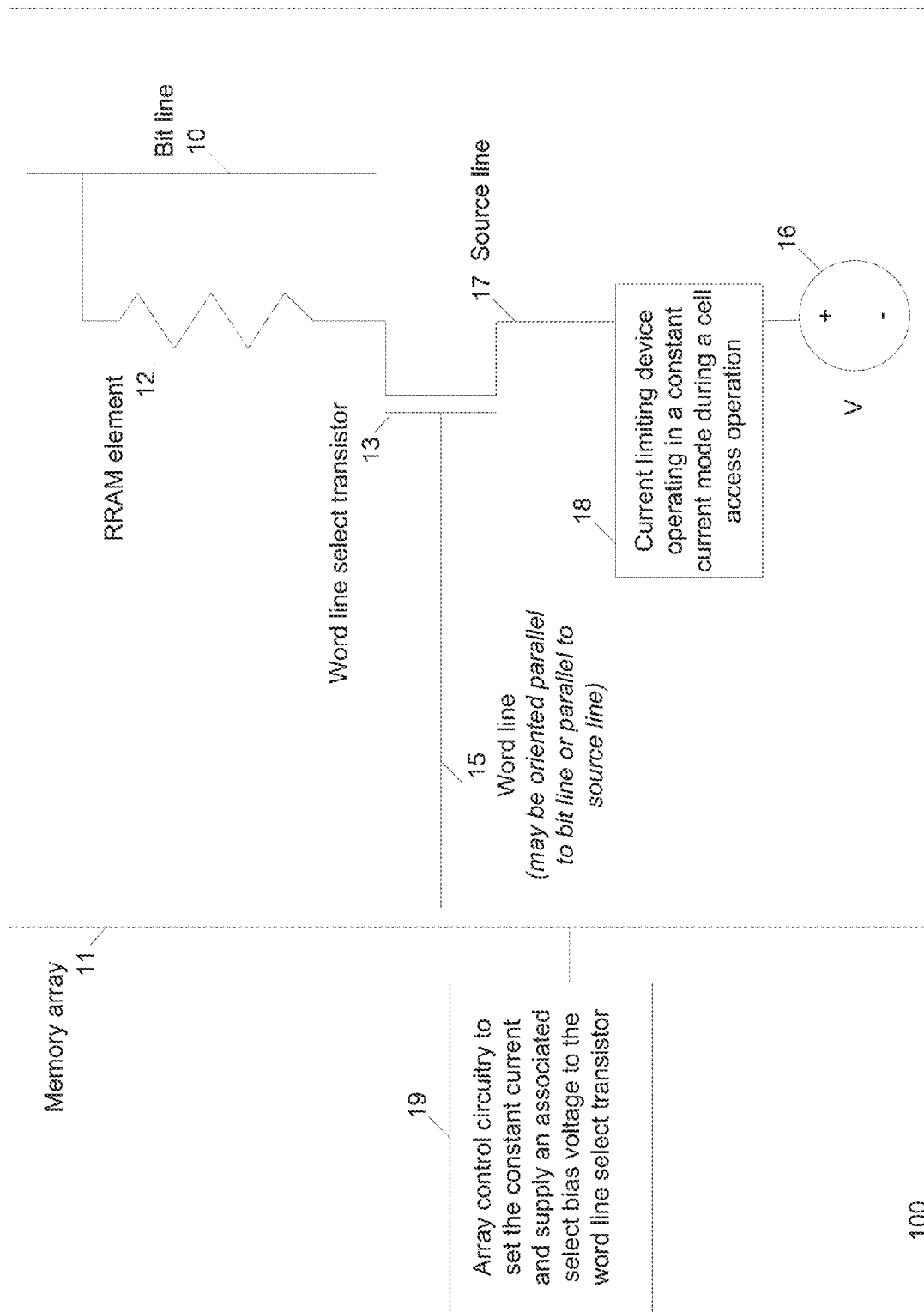
FIG. 1 is an illustration of a memory device having a memory cell with a source line pulled down by a current limiting device.

FIG. 1 is an illustration of a memory device having a memory cell with a source line pulled down by a current limiting device.

System 100 includes a memory array 11 including a plurality of memory cells, of which a memory cell including RRAM element 12 is illustrated. The RRAM element 12 may be a two-terminal device with one terminal coupled to the bit line 10 and the other terminal coupled to the word line select transistor 13, which is in turn coupled to the word line 15. A current limiting device 18 is coupled between the source line 17 and a supply voltage 16. In an example, the current limiting device 18 is configured to operate in a constant current mode during a cell access operation.

The memory array 11 is also coupled to an array control circuitry 19. The array control circuitry 19 may be configured to control the constant current mode and supply an associated selected bias voltage to the word line select transistor 13. In an example, the array control circuitry 19 may be configured to simultaneously select, for programming from a high resistance state to a low resistance state, a memory element of another memory cell of the memory cell array 11 with the memory element 12.

In an example, the current limiting device 18 includes a pull-down transistor biased in saturation. In an example, the size of the pull-down transistor may be greater than a size of the word line select transistor 13.

In an example, the array control circuitry 19 includes a diode configured stack of transistors including at least a first transistor and a second transistor. The first transistor of the stack may be selectively coupled to a gate of the word line select transistor 13. The second transistor of the stack may be coupled to the gate of the current limiting device 18. In an example, the diode configured stack of transistors may include differently sized transistors including at least a first transistor of a first size and a second transistor of a second different size. In an example, the first size may correspond to, e.g. match, the size of the word line select transistor 13. In an example, the second size may correspond to, e.g. match, the size of the current limiting device 18, which may be greater than the size of the word line select transistor 13.

In an example, the source line 17 of the memory array 11 may run parallel to the bit line 10 of the memory array 11. In an example, the source line 17 of the memory array 11 may run parallel to the word line 15 of the memory array 11.

Figure 2:
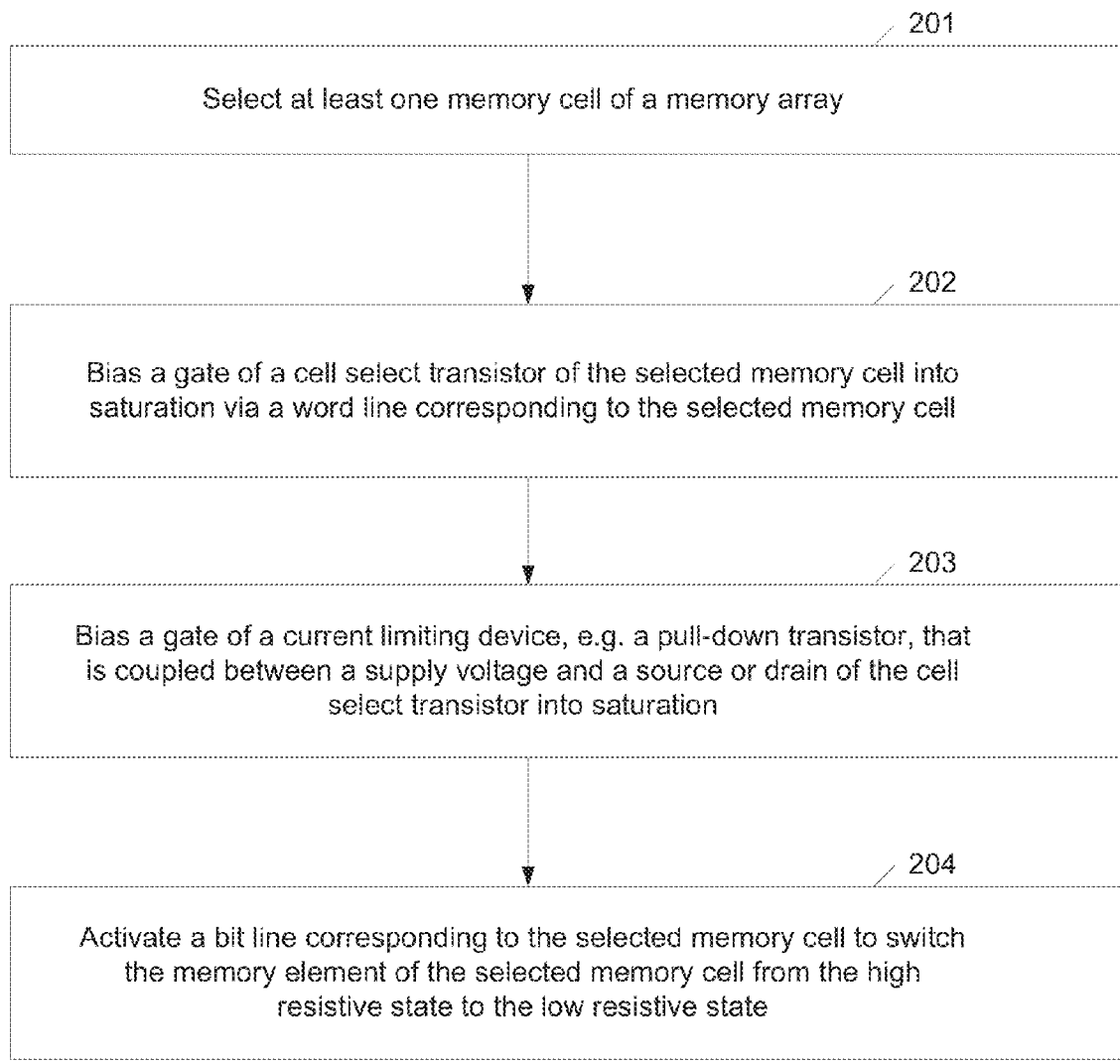
FIG. 2 is an illustration of a process for using the system described in FIG. 1.

FIG. 2 is an illustration of a process for using the system described in FIG. 1.

In block 201, a memory cell of the memory array is selected. In block 202, the array control circuitry biases a gate of a cell select transistor of the selected memory cell into saturation via a word line corresponding to the selected memory cell. In block 203, the array control circuitry biases a gate of a current limiting device, e.g. a pull-down transistor, that is coupled between a supply voltage or and a source or drain of the cell select transistor into saturation. In block 204, the array control circuitry activates a bit line corresponding to the selected memory cell to switch the memory element of the selected memory cell from the high resistive state to the low resistive state.

Figure 3:
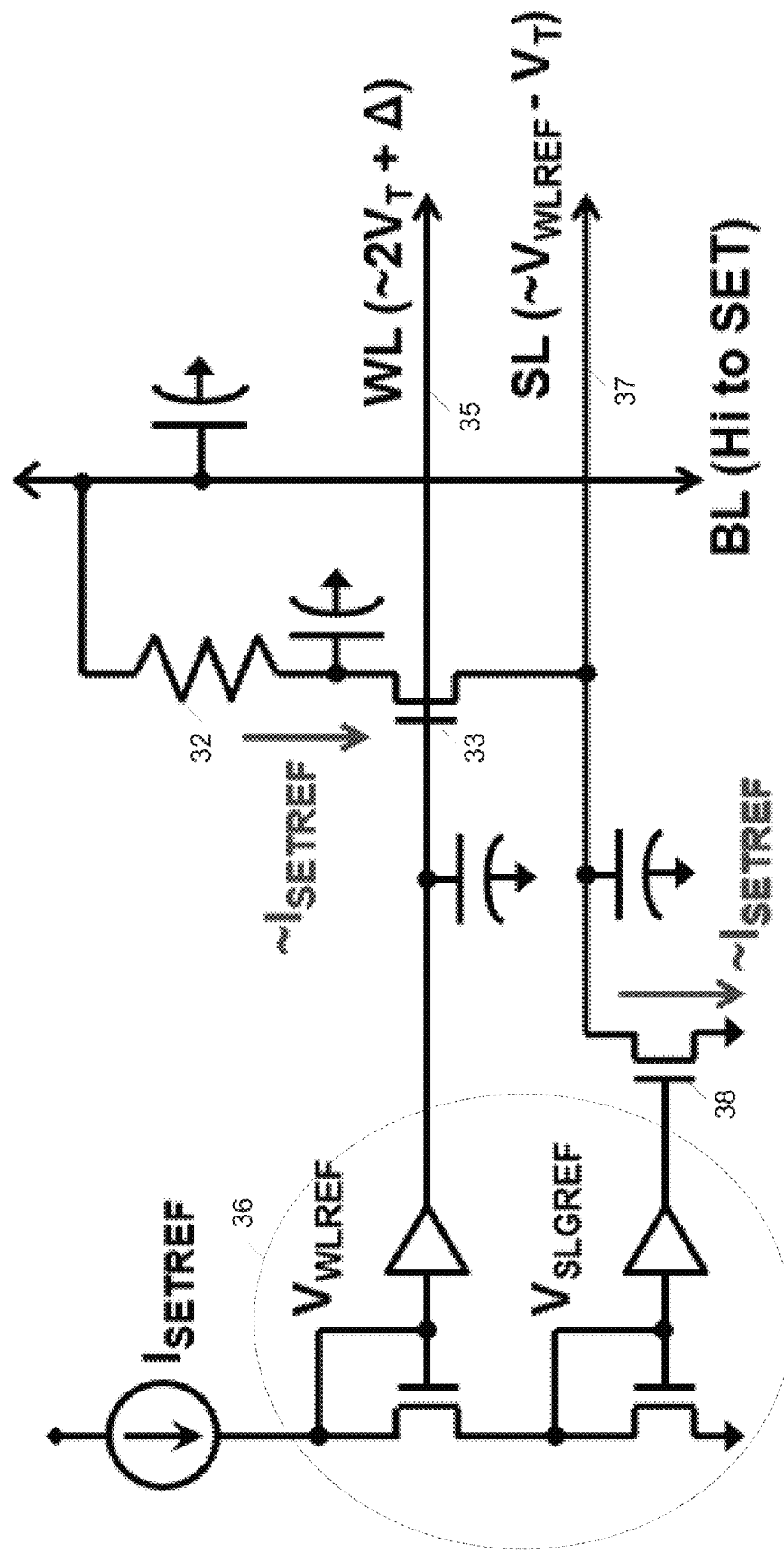
FIG. 3 is an illustration of a source line being driven by a pull-down MOS transistor biased in saturation.

FIG. 3 is an illustration of a source line being driven by a pull-down MOS transistor biased in saturation.

In the example, the voltage levels for the gate of the source line pull-down 38 and the word line 35 are generated by passing a reference current ($I_{SETREF}$) through a diode configured stack 36 of two MOS transistors including a first transistor that matches the sizing of the cell select transistor 33 and a second transistor that matches the sizing of the source line pull-down transistor 38.

If the source line voltage remains higher than one voltage threshold below $V_{SLGREF}$, the source line pull-down will remain in saturation and have its $I_{DSAT}=I_{SETREF}$. In an example, the voltage $V_{SL}$ may be at approximately $V_{SLGREF}$, higher if the voltage threshold is greater than the reference device. This variation in $V_{SL}$ occurs because the cell select transistor 33 acts as a cascode device, adjusting $V_{SL}$ up or down until the cascode $I_{DSAT}$ matches the source line pull-down $I_{DSAT}$. The cascode function is distributed in that the cascode function is performed by the cell select transistor 33 of the selected cell located along the source line 37 rather than in immediate proximity to the source line pull-down transistor 38.

In the example illustrated with reference to FIG. 3, the source line 37 is running horizontally in parallel with the word line 35. However, it is also possible and practical to apply the principles described herein in a configuration where a source line runs vertically in parallel with a bit line. Running the source line in parallel with the bit line may allow multiple cells on a row to be simultaneously selected for a set operation.

Figure 4:
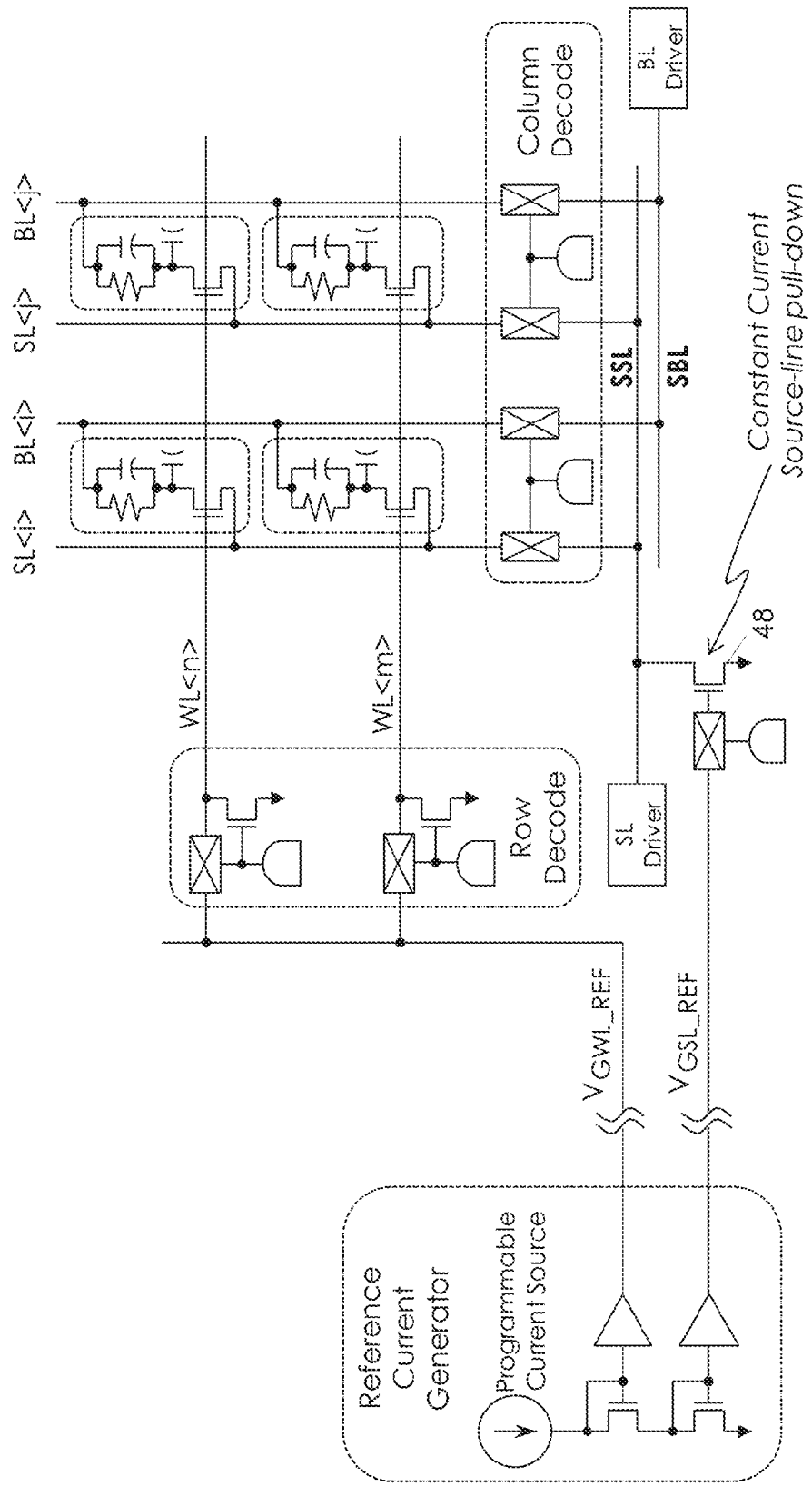
FIG. 4 is an illustration of a configuration using a current limiting device, e.g. a pull-down transistor biased in saturation, with a source line running in parallel with a bit line.

FIG. 4 is an illustration of a configuration using a current limiting device, e.g. a pull-down transistor biased in saturation, with a source line running in parallel with a bit line.

Figure 5:
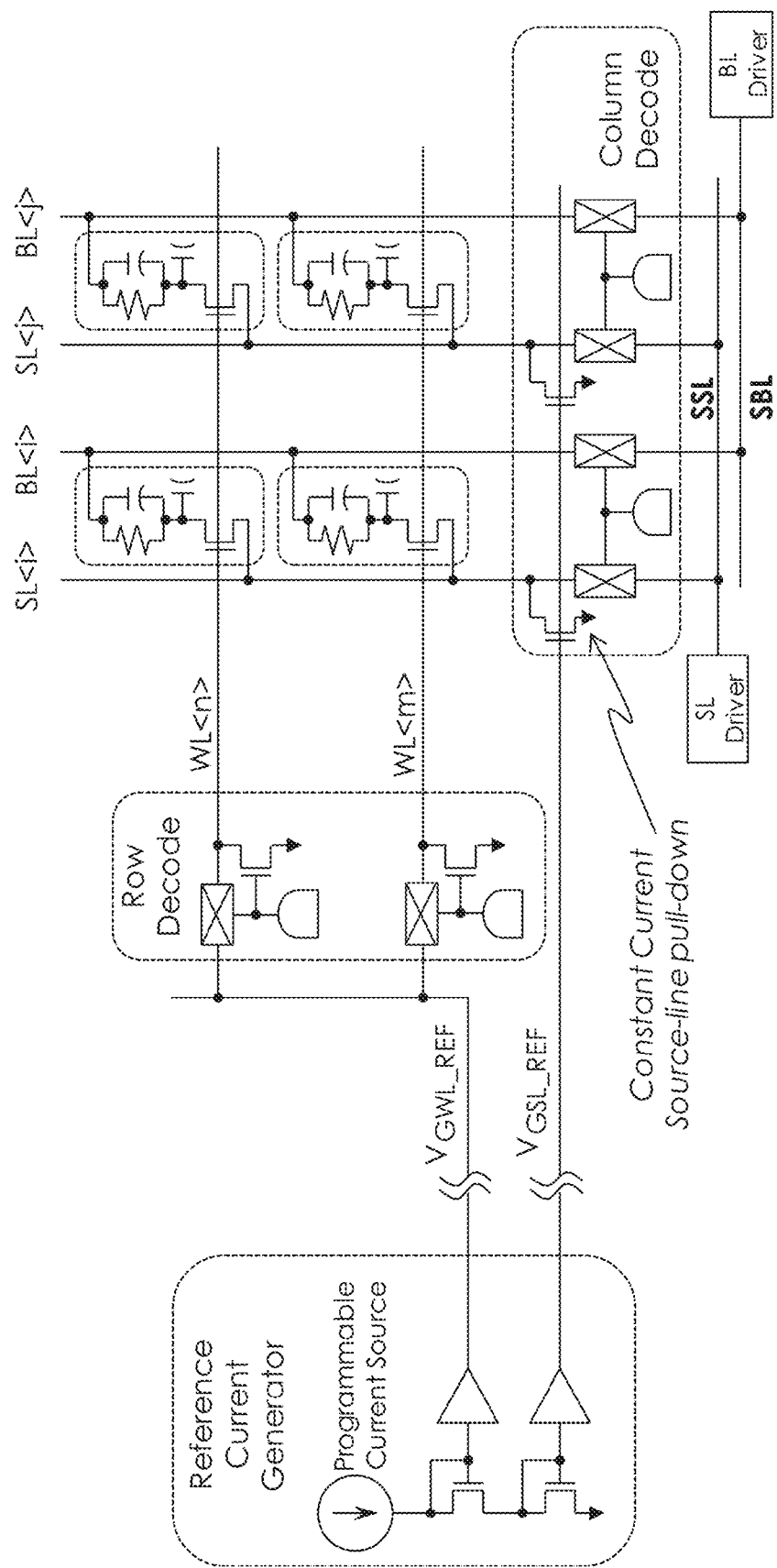
FIG. 5 is an illustration of another configuration using a current limiting device, e.g. a pull-down transistor biased in saturation, with a source line running in parallel with a bit line.

In the configuration of FIG. 4, a pull-down transistor 48 is placed after a column selector to provide sharing among multiple columns There may be a many to one ratio between cells and source line pull down because the source line pull down occurs on a per column basis, e.g. once per column. Accordingly, the pull-down transistor 58 may be larger than the cell select transistor to minimize voltage threshold variations with minimal effect on product footprint. FIG. 5 is an illustration of another configuration using a current limiting device, e.g. a pull-down transistor biased in saturation, with a source line running in parallel with a bit line.

Figure 6:
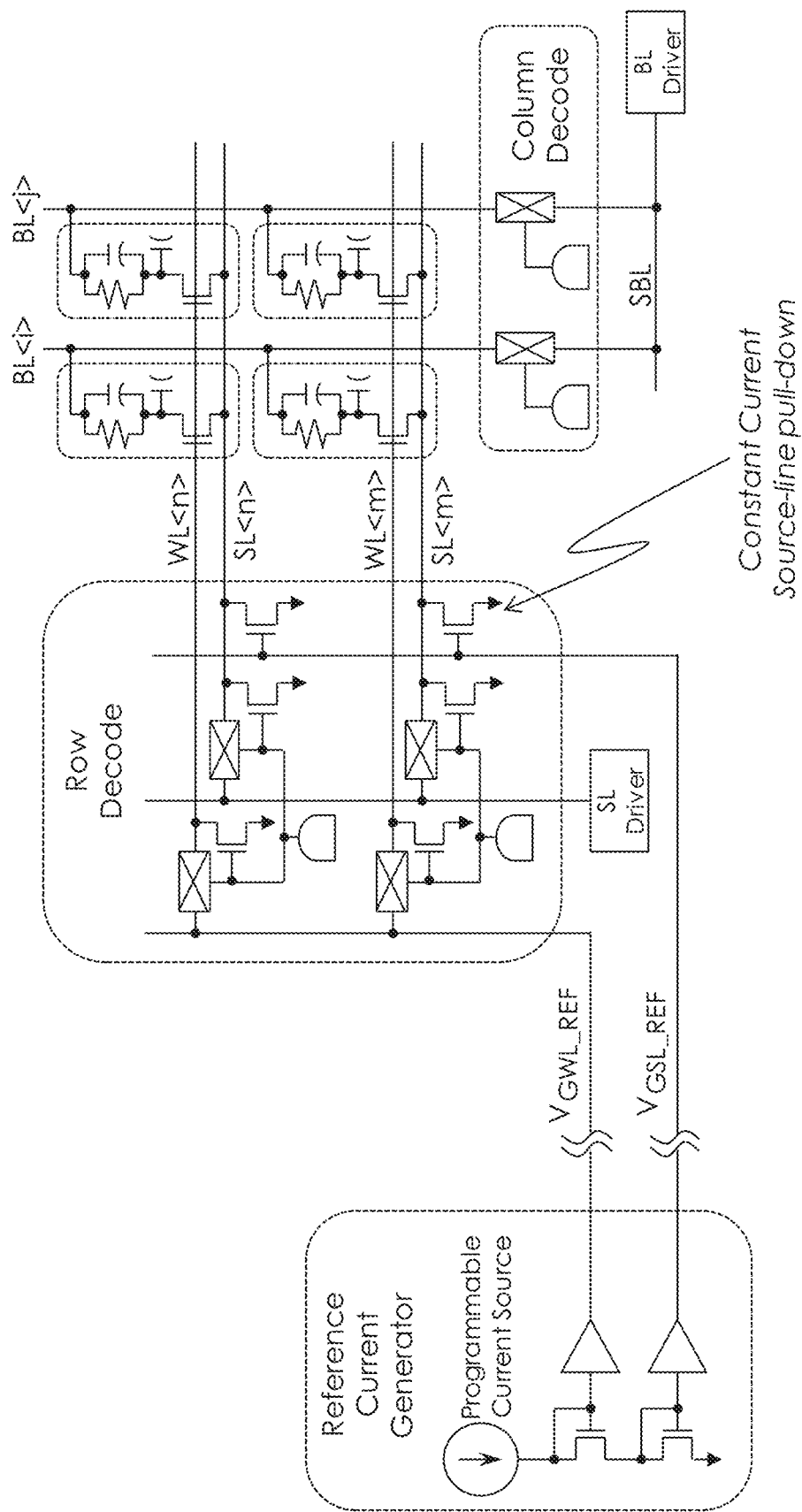
FIG. 6 is an illustration of a configuration using a current limiting device, e.g. a pull-down transistor biased in saturation, with a source line running in parallel with a word line.

FIG. 6 is an illustration of a configuration using a current limiting device, e.g. a pull-down transistor biased in saturation, with a source line running in parallel with a word line. This configuration may allow the source line to weakly connect to all bit lines, where $V_{BL}$ is different than $V_{SL}$. The voltage $V_{SL}$ may be pinned by bit lines. This configuration may allow cell size to be reduced.

A person of ordinary skill in the art will recognize that they may make many changes to the details of the above-described stacked memory device without departing from the underlying principles. Only the following claims, however, define the scope of the disclosure.

What is claimed is:

1. An apparatus, comprising:
    a memory cell array, wherein:
    a memory element of a memory cell of the memory cell array is coupled to a source line of the memory cell array through a word line select transistor; and
    a current limiting device is coupled between the source line and a supply voltage, the current limiting device to operate in a constant current mode during an access operation of the memory cell; and
    an array control circuitry coupled to the memory cell array, the array control circuitry configured to control the constant current mode and supply an associated select bias voltage to the word line select transistor.

2. The apparatus of claim 1, wherein a source line of the memory cell array runs parallel to the bit line.

3. The apparatus of claim 1, wherein a source line of the memory cell array runs parallel to the word line.

4. The apparatus of claim 3, wherein the array control circuitry is configured to simultaneously select, for programming from a high resistance state to a low resistance state, another memory cell of the memory cell array.

5. The apparatus of claim 1, wherein the current limiting device comprises a pull-down transistor biased in saturation.

6. The apparatus of claim 5, wherein the array control circuitry comprises a diode configured stack of transistors, wherein a first transistor of the stack is selectably coupled to a gate of the word line select transistor and a second transistor of the stack is coupled to a gate of the pull-down transistor.

7. The apparatus of claim 6, wherein the diode configured stack of transistors comprises a diode configured stack of differently sized transistors.

8. The apparatus of claim 7, wherein a first size of the word line select transistor is less than a second size of the pull-down transistor.

9. The apparatus of claim 8, wherein a size of the first transistor of the stack corresponds to the first size, and wherein a size of the second transistor of the stack corresponds to the second size.

10. The apparatus of claim 1, wherein the memory element comprises a two terminal device.

11. A method, comprising:
   selecting at least one memory cell of a memory array;
   biasing a gate of a cell select transistor of the selected memory cell into saturation via a word line corresponding to the selected memory cell;
   biasing a gate of a pull-down transistor that is coupled between a supply voltage and a source or drain of the cell select transistor into saturation; and
   activating a bit line correspond to the selected memory cell to switch a memory element of the selected memory cell from a high resistance state to a low resistance state while the gates are biased into saturation.

12. The method of claim 11, wherein biasing the gate of the cell select transistor of the selected memory cell into saturation via the word line corresponding to the selected memory cell further comprises biasing the gate of the cell select transistor more than a threshold voltage above the gate of the pull-down transistor.

13. The method of claim 11, further comprising:
   biasing at least one of a bit line or word line corresponding to an unselected memory cell of the memory cell differently than a respective one of the bit line or the word line of the selected memory cell to cause a memory element of the unselected memory cell to conduct less current than the memory element of the selected memory cell.

14. The method of claim 13, wherein the memory element of the unselected memory cell conducts no current.

15. An apparatus for operating a memory array, the apparatus comprising:
   means for biasing a gate of a cell select transistor of a selected memory cell into saturation via a word line corresponding to the selected memory cell;
   means for biasing a gate of a pull-down transistor that is coupled between a supply voltage and a source or drain of the cell select transistor into saturation; and
   means for activating a bit line correspond to the selected memory cell to switch a memory element of the selected memory cell from a high resistance state to a low resistance state while the gates are biased into saturation.

16. The apparatus of claim 15, wherein the gate of the cell select transistor is biased more than a threshold voltage above the gate of the pull-down transistor.

17. The apparatus of claim 15, further comprising:
   means for biasing at least one of a bit line or word line corresponding to an unselected memory cell of the memory cell differently than a respective one of the bit line or the word line of the selected memory cell to cause a memory element corresponding to the unselected memory cell to conduct less current than the memory element of the selected memory cell.

18. The apparatus of claim 17, wherein the memory element of the unselected memory cell conducts no current.

* * * * *